(12) United States Patent
Borchert

(10) Patent No.: US 6,836,500 B2
(45) Date of Patent: Dec. 28, 2004

(54) SEMICONDUCTOR LASER CHIP AND METHOD FOR FABRICATING A SEMICONDUCTOR LASER CHIP

(75) Inventor: Bernd Borchert, Moosburg (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 09/944,823

(22) Filed: Aug. 31, 2001

(65) Prior Publication Data

US 2002/0102756 A1 Aug. 1, 2002

(30) Foreign Application Priority Data

Aug. 31, 2000 (DE) .......................... 100 42 904

(51) Int. Cl.⁷ ................................. H01S 3/08
(52) U.S. Cl. .................... 372/101; 372/92; 372/99; 372/102; 372/75; 372/43; 372/44; 372/45; 372/46; 372/47; 372/48; 372/49; 372/50; 372/101; 372/108; 438/29; 438/16; 257/98
(58) Field of Search ........................... 372/92, 99, 102, 372/75, 43–50, 101, 108; 438/29, 16; 257/98

(56) References Cited

U.S. PATENT DOCUMENTS

| 5,309,468 | A | * | 5/1994 | Makiuchi .................... 372/50 |
| 5,553,089 | A | * | 9/1996 | Seki et al. ................... 372/43 |
| 5,633,527 | A | * | 5/1997 | Lear ........................... 257/432 |
| 5,771,250 | A | * | 6/1998 | Shigehara et al. ............ 372/6 |
| 5,802,086 | A | * | 9/1998 | Hargis et al. ................. 372/22 |
| 6,064,527 | A | | 5/2000 | Bylsma et al. |
| 6,097,742 | A | * | 8/2000 | Caprara et al. .............. 372/22 |
| 6,263,002 | B1 | * | 7/2001 | Hsu et al. ..................... 372/6 |
| 2001/0030984 | A1 | * | 10/2001 | Ono et al. .................... 372/43 |

FOREIGN PATENT DOCUMENTS

| DE | 24 36 908 A1 | 2/1975 |
| EP | 10 35 423 A2 | 9/2000 |
| JP | 2-199882 A | 8/1990 |

* cited by examiner

Primary Examiner—Minsun Oh Harvey
Assistant Examiner—Delma R. Flores Ruiz
(74) Attorney, Agent, or Firm—Altera Law Group, LLC; Jeffrey R. Stone

(57) ABSTRACT

A semiconductor laser chip has a semiconductor laser element and a beam shaper integrated into the semiconductor laser chip and serving for shaping a laser beam emitted by the semiconductor laser element.

7 Claims, 3 Drawing Sheets

SEMICONDUCTOR LASER CHIP AND METHOD FOR FABRICATING A SEMICONDUCTOR LASER CHIP

The invention relates to a semiconductor laser chip and also a method for fabricating a semiconductor laser chip.

In the field of optical telecommunications, in particular, it is necessary to guide a laser beam emitted by a semiconductor laser into an optical fibre and to transmit said laser beam through the optical fibre from a transmitter, the semiconductor laser, to a receiver, for example a telecommunications switching element or else a further communications element, generally an optical receiver.

Coupling the emitted light power of an edge emitting semiconductor laser into an optical fibre is made considerably more difficult by the lack of near-field spot matching between the semiconductor laser and a customary optical fibre.

The spot diameter of a customary semiconductor laser is approximately 1 μm to 2 μm for the fundamental mode, preferably 1.5 μm transversely and 2 μm to 3 μm laterally.

In an optical fibre, the spot diameter is determined by its core diameter and lies in a region of 6 μm.

Without additional measures, the lack of near-field spot matching explained above leads to semiconductor laser chip/optical fibre coupling efficiencies of less than 10% to 20% in particular in the region of the wavelength range of 1.3 μm to 1.5 μm which is important for optical message transmission.

In order to improve the semiconductor laser chip/optical fibre coupling efficiency it is known to provide a coupling-in optical arrangement having a single-lens or multi-lens system, by means of which the laser beam emitted by the edge emitting semiconductor laser chip is focused by means of the coupling-in optical arrangement as beam shaper and is coupled into the optical fibre in a corresponding form matched in respect of spot diameter.

The coupling-in optical arrangement is usually arranged between the semiconductor laser chip and the optical fibre that is to be coupled to the semiconductor laser chip.

According to the prior art, however, the entire system of semiconductor laser chip/coupling-in optical arrangement/optical fibre is realized as a hybrid arrangement, for which reason a considerable disadvantage of this system can be seen in the requisite high-precision and thus complex adjustment of the coupling-in optical arrangement or of the lenses present in the coupling-in optical arrangement relative to the semiconductor laser chip.

Consequently, the invention is based on the problem of specifying a semiconductor laser chip and also a method for fabricating a semiconductor laser chip with which laser light is coupled into an optical fibre in a simplified and thus cost-effective manner, with coupling efficiencies comparable to those of the known system.

The problem is solved by means of the semiconductor laser chip and also by means of the method for fabricating a semiconductor laser chip having the features in accordance with the independent patent claims.

A semiconductor laser chip has a semiconductor laser element and a beam shaper integrated into the semiconductor laser chip. The beam shaper serves for shaping a laser beam emitted by the semiconductor laser element and is arranged in a manner integrated in the semiconductor laser chip in the exit direction of the laser beam emitted by the semiconductor laser element in such a way that the laser beam emitted by the semiconductor laser element is guided through the beam shaper and its beam shape is altered in accordance with the configuration of the beam shaper and the laser beam altered by the beam shaper can be fed to an optical fibre, for example. The beam shaper preferably has a predetermined concentration profile of oxidized aluminium.

In a method for fabricating a semiconductor laser chip, a semiconductor laser element is formed and a beam shaper is formed in the exit direction of a laser beam emitted by the semiconductor laser element, in such a way that the emitted laser beam is guided through the beam shaper.

The beam shaper is formed as follows:
  a beam shaper region is formed in the exit direction of a laser beam emitted by the semiconductor laser element, the beam shaper region containing aluminium,
  a desired aluminium concentration profile is formed in the beam shaper region,
  a selective oxidation of the beam shaper region is carried out, in such a way that the beam shaper is formed depending on the aluminium concentration profile.

The invention can clearly be seen in the fact that both the semiconductor laser element and the beam shaper, which essentially corresponds to a coupling-in optical arrangement, are integrated together in a semiconductor laser chip.

The invention has significant advantages over the prior art.

In particular, the semiconductor laser chip according to the invention is compact, simple to fabricate and, on account of the integral embodiment, highly insusceptible to disturbances and robust.

Furthermore, complex adjustment of the coupling-in optical arrangement as in the case of the hybrid arrangement in accordance with the prior art is no longer necessary.

Preferred developments of the invention emerge from the dependent claims.

The beam shaper can be monolithically integrated into the semiconductor laser chip.

Furthermore, the beam shaper can have aluminium-containing material, preferably a material combination of at least one of the following material systems:
  indium gallium aluminium antimonide (InGaAlSb),
  gallium aluminium arsenide antimonide, (GaAlAsSb), or
  indium aluminium arsenide antimonide (InAlAsSb).

Since aluminium oxide, in particular, has a lower refractive index than the semiconductor material usually used for the semiconductor laser element, the desired beam shaper functionality can be realized very exactly by oxidation of the aluminium-containing material by means of selective wet oxidation or dry oxidation of a beam shaping region, thereby forming the beam shaper.

Between the semiconductor laser element and the beam shaper it is possible to provide a trench and/or a groove, which separate the semiconductor laser element and the beam shaper from one another in such a way that an air gap is formed in the exit direction of the semiconductor element, at the laser beam exit edge thereof, between the laser beam exit edge and the laser-end entry region of the beam shaper, which air gap may, for example, be filled with a predetermined dielectric.

The air gap and/or the trench clearly form a front side mirror which can advantageously be used in particular when an FP laser (Fabry-Perot laser) is used.

However, even without the air gap, for example a configuration of the semiconductor laser element as a DFB laser (Distributed Feed Back laser) forms a highly efficient semiconductor laser that is insusceptible to disturbances.

The beam shaper can be configured in such a way that the light beam emitted by the semiconductor laser element is brought to a desired form, for example focused, in accordance with the optical laws.

Thus, the beam shaper can also be configured as a concave or convex lens in order to realize the corresponding beam shaper function.

The trench or the spacing between the laser beam emission edge of the semiconductor laser element and the laser-beam-end surface of the beam shaper preferably lies in a region of at most 15 $\mu$m.

The beam shaper can be formed for example by forming a beam shaper region in the exit direction of a laser beam emitted by the semiconductor laser element, said region containing aluminium or aluminium-containing material.

A desired aluminium concentration profile is formed in the beam shaper region and a selective oxidation of the beam shaper region is subsequently carried out in such a manner that the beam shaper is configured in the desired shape depending on the aluminium concentration profile.

This procedure, in particular, is distinguished by its simplicity and the small number of process steps required for fabricating the semiconductor laser chip together with the coupling-in optical arrangement, i.e. the beam shaper.

A further advantage of the invention is to be seen in the fact that a high semiconductor laser chip/optical fibre coupling efficiency is coupled in when the laser beam which is emitted by the semiconductor laser element and is guided through the beam shaper is coupled into an optical fibre.

Exemplary embodiments of the invention are illustrated in the figures and are explained in more detail below.

In the figures,

FIG. 1 shows a semiconductor laser chip 100 in accordance with a first exemplary embodiment of the invention.

Figure 1:
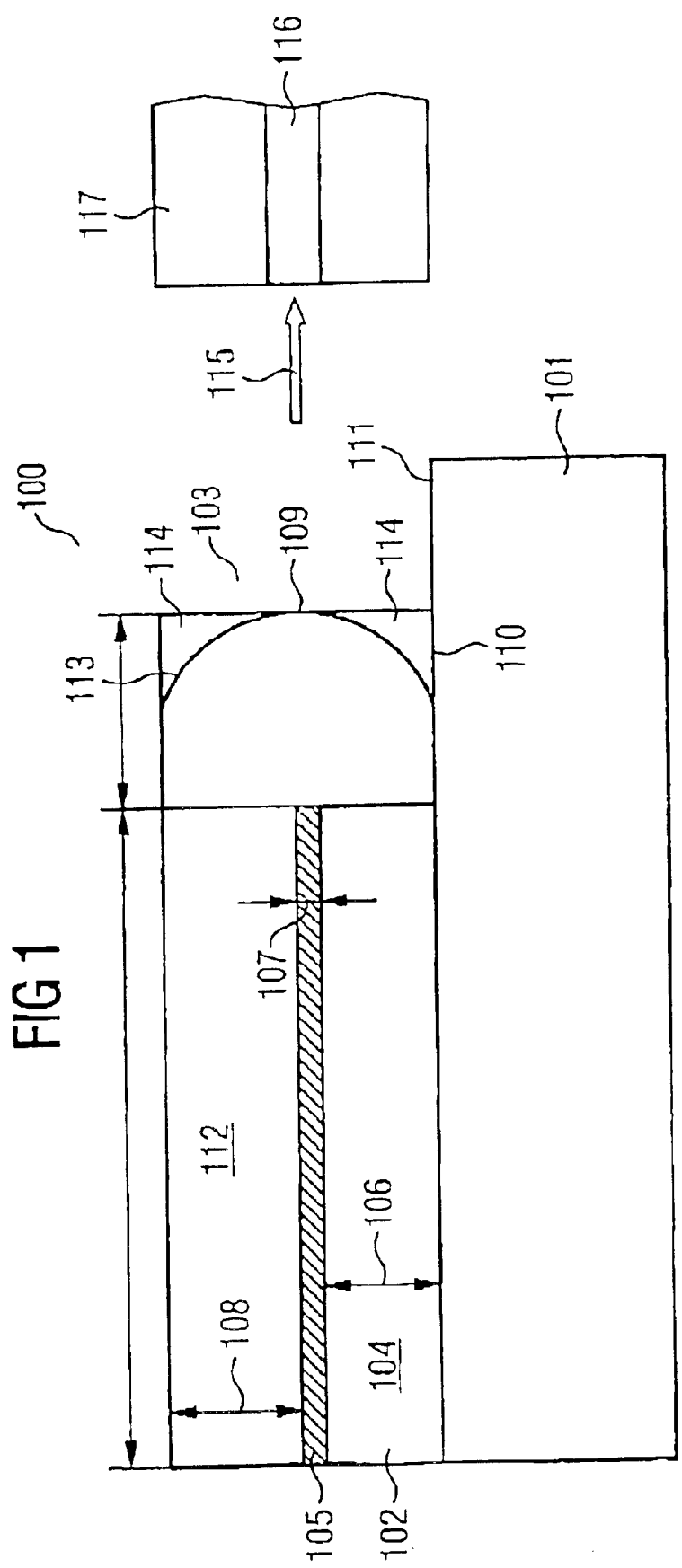
FIG. 1 shows a cross section through a semiconductor laser chip in accordance with a first exemplary embodiment of the invention.

The semiconductor laser chip 100 has a substrate 101, a semiconductor laser element 102 and also a beam shaper 103.

The semiconductor laser element 102 is formed on the substrate 101 in a first step by means of a customary fabrication method for fabricating a semiconductor laser element.

The semiconductor laser element 102 in accordance with the first exemplary embodiment is configured as a DFB semiconductor laser element.

The semiconductor laser element 102 has a lower cladding layer 104, an active layer 105, in which the laser beam is generated, and also an upper cladding layer 112.

The substrate 101 used may be gallium arsenide (GaAs) or indium phosphide (InP), and the semiconductor laser element used may be a semiconductor laser having material from the material system indium gallium aluminium arsenide, indium gallium arsenide phosphide or indium gallium aluminium phosphide (for a laser beam having a wavelength range in the red colour spectrum).

If indium phosphide is used as the substrate 101, then it is advantageous to provide a metamorphous transition layer (not illustrated) for matching the different lattice constants of the materials of the semiconductor laser element 102 relative to the lattice constants of the indium phosphide.

The metamorphous transition layer has a composition of the material system aluminium gallium arsenide antimonide (AlGaAsSb), which composition is chosen depending on the desired lattice matching.

A height of the lower cladding layer 104, which height is illustrated by a first arrow 106 symbolized in FIG. 1, is 2 $\mu$m to 4 $\mu$m in accordance with the exemplary embodiment.

The active layer 105 has a thickness of 0.1 $\mu$m to 0.2 $\mu$m, symbolized by a second arrow 107.

Furthermore, the upper cladding layer 112 has a thickness of 2 $\mu$m to 4 $\mu$m, symbolized by a third arrow 108.

In a further step, a beam shaper region 103 is formed as an aluminium-containing layer stack.

The aluminium-containing layer stack has materials from at least one of the following three material systems:

indium gallium aluminium arsenide system (InGaAlAs) (particularly suitable for a substrate 101 made of indium phosphide and gallium arsenide), gallium aluminium arsenide antimonide system (GaAlAsSb) (particularly suitable for a substrate 101 made of indium phosphide), or indium aluminium arsenide antimonide system (InAlAsSb) (particularly suitable for a substrate 101 made of indium phosphide).

An exit edge 109—running essentially vertically—of the beam shaper 103 is formed by using a dry etching method.

Figure 3:
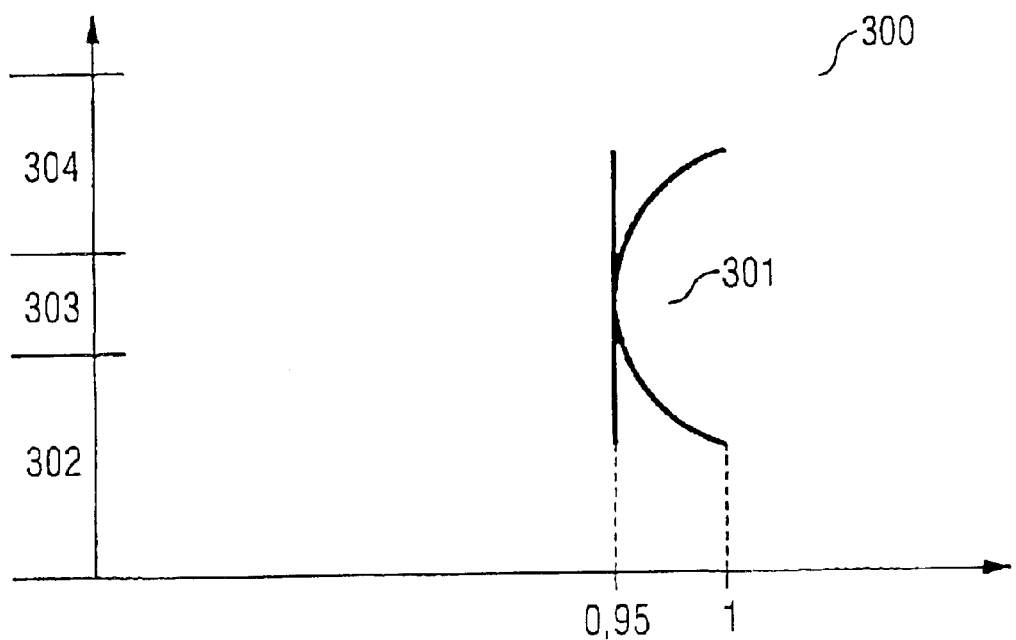
FIG. 3 shows a diagram illustrating the material composition gradient of aluminium along the vertical structure within the beam shaper region.

In a further step, a material composition gradient 300 corresponding, in principle, to the profile illustrated in FIG. 3 is formed in the beam shaper region, and it should be noted that the corresponding material composition gradient 300 can already be formed during the fabrication of the aluminium-containing layer stack, by means of appropriate compositions of the gas used for deposition.

As is illustrated in FIG. 3, the profile 301 of the material composition gradient of aluminium within the aluminium-containing layer stack of the beam shaper 103 is formed in such a way that, in accordance with this exemplary embodiment, the respective maximum proportion of aluminium is contained at the lower surface 110 of the aluminium-containing layer stack which is grown on the surface 111 of the substrate 101.

The material composition gradient 301 runs essentially parabolically along the lower cladding layer 104, the active region 105 and the upper cladding layer 112, with the result that, in a first region 302 in the height range of the lower cladding layer, i.e. in the first 2 $\mu$m to 4 $\mu$m of the aluminium-containing layer stack, from the maximum aluminium content, the profile forms a continuous reduction in the aluminium content along the vertical growth direction.

In a second region 303, which essentially corresponds to the height range of the active layer 105, the aluminium content is reduced to at most 90% of the maximum aluminium content, preferably to at most 95% of the maximum aluminium content, and then increased again along the parabolic profile 301, which continues in a third region 304 corresponding to the upper cladding layer 112, with the result that the maximum aluminium content is formed again at an upper surface 113 of the beam shaper 103.

In a further step, a selective wet oxidation is carried out on the aluminium-containing layer stack, with the result that the aluminium-containing material is oxidized to form aluminium oxide ($Al_2O_3$) in accordance with the aluminium concentration in the respective material, the refractive index of usually 2.9 to 3.5 in the aluminium-containing layer stack decreasing to approximately 1.6 to 1.8 for the region 114, which contains dialuminium trioxide.

Since the oxidation rate in the context of the selective wet oxidation greatly depends on the aluminium concentration, it is thus clearly possible, by means of the selective wet oxidation of aluminium-containing semiconductor layers, i.e. the aluminium-containing layer stack, with a vertical aluminium concentration profile 301 that can basically be predetermined as desired, to realize any desired oxidation front, for example including a shape of a lens or a beam shaper function.

By using a curved mask for the etching of the vertical emission edge 109 of the beam shaper 103, even a two-dimensional beam shaper or a two-dimensional lens can be monolithically realized in accordance with one refinement of the invention.

A laser beam emitted by the semiconductor laser element 102, said laser beam being symbolized by a fourth arrow 115 in FIG. 1, is thus guided from the active layer 105 directly through the beam shaper 103 and preferably into a core 116 of an optical fibre 117.

Figure 2:
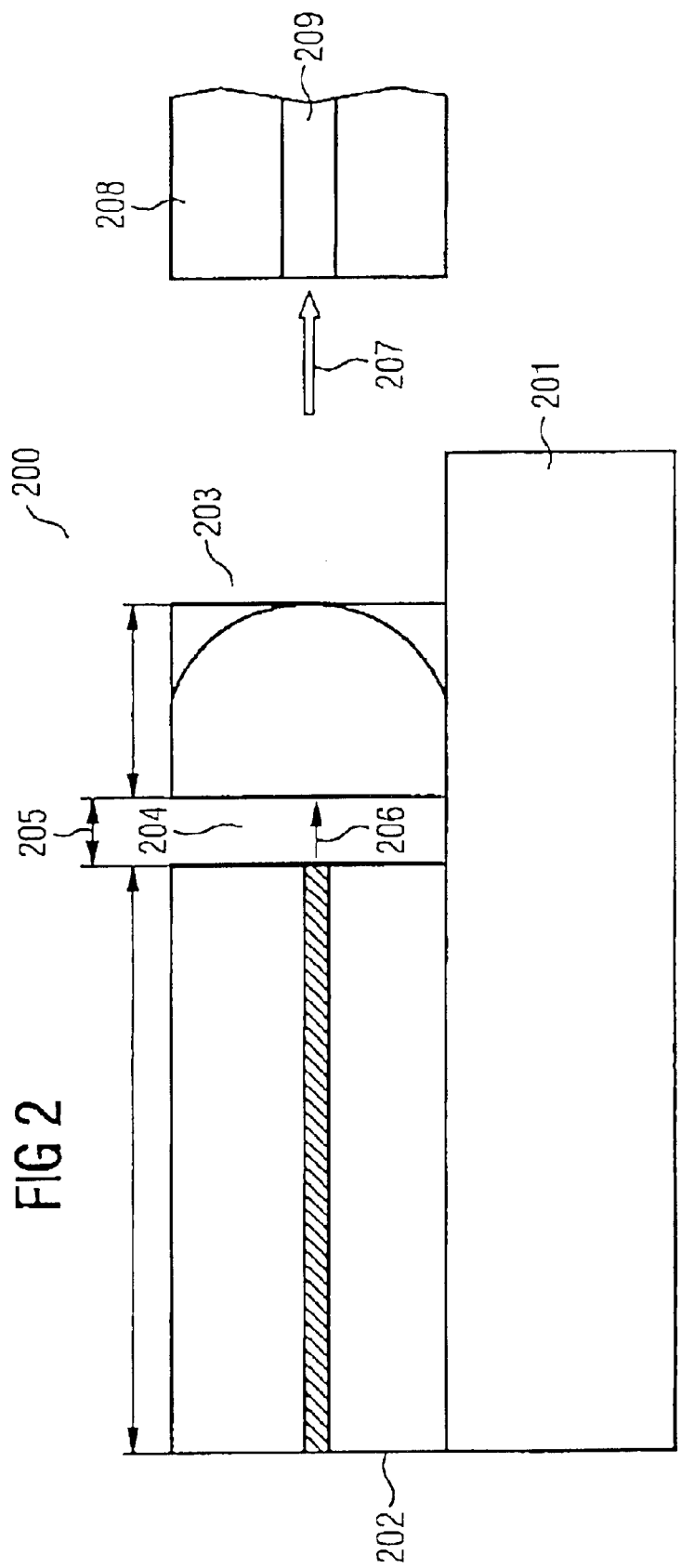
FIG. 2 shows a cross section through a semiconductor laser chip in accordance with a second exemplary embodiment of the invention.

FIG. 2 shows a semiconductor laser chip 200 in accordance with a second exemplary embodiment of the invention.

The semiconductor laser chip 200 has a substrate 201, a semiconductor laser element 202 and also a beam shaper 203.

The individual elements 202, 203 are configured as in the case of the semiconductor laser chip 100 in accordance with the first exemplary embodiment, with the difference that the semiconductor laser element 202 in accordance with the second exemplary embodiment is configured as an FP laser.

With regard to the configuration and the fabrication of the further elements of the semiconductor laser chip 200 in accordance with the second exemplary embodiment, reference is made to the explanations with regard to the configuration and the fabrication of the semiconductor laser chip 100 in accordance with the first exemplary embodiment, since the individual fabrication processes are identical to the fabrication method of the first exemplary embodiment.

In a concluding step, however, in accordance with this second exemplary embodiment, a trench 204 is etched between the semiconductor laser element 202 and the beam shaper 203, which trench forms an air gap, to describe it clearly in functional terms an etched mirror, which forms a front side mirror which is usually used for an FP laser.

The air gap 204 has a width of at most 10 $\mu$m, as is symbolized by a double arrow 205 in FIG. 2.

The trench 204 is etched into the structure formed by the semiconductor laser element 202 and the beam shaper 203 by means of a dry etching method.

A laser beam 206 which is generated by the semiconductor laser element 202 in the active layer thereof and emitted is guided through the trench 204 and then through the aluminium-containing layer stack, i.e. the beam shaper 203, and fed as shaped laser beam 207 to an optical fibre 208, in particular the core 209 thereof.

List of Reference Symbols

100 Semiconductor laser chip
101 Substrate
102 Semiconductor laser element
103 Beam shaper
104 Lower cladding layer
105 Active layer
106 Thickness of lower cladding layer
107 Thickness of active layer
108 Thickness of upper cladding layer
109 Exit edge of beam shaper
110 Lower surface of beam shaper
111 Surface of substrate
112 Upper cladding layer
113 Upper surface of beam shaper
114 Region of aluminium oxide
115 Laser beam
116 Core of optical fibre
117 Optical fibre
200 Semiconductor laser chip
201 Substrate
202 Semiconductor laser element
203 Beam shaper
204 Trench
205 Width of trench
206 Laser beam
207 Shaped laser beam
208 Optical fibre
209 Optical fibre core
300 Material composition gradient
301 Profile of material composition gradient
302 First region
303 Second region
304 Third region

What is claimed is:

1. Semiconductor laser chip having a semiconductor laser element, beam shaper integrated into the semiconductor laser chip and serving to shape a laser beam emitted by the semiconductor laser element, and a trench introduced between the semiconductor laser element and the beam shaper, the semiconductor laser element being configured as an FP semiconductor laser element, the beam shaper being arranged in a manner integrated in the semiconductor laser element in the exit direction of a laser beam emitted by the semiconductor laser element, such that the emitted laser beam is guided through the beam shaper, the beam shaper having a predetermined concentration profile of oxidized aluminium.

2. Semiconductor laser chip according to claim 1, in which the beam shaper is monolithically integrated in the semiconductor laser chip.

3. Semiconductor laser chip according to claim 1, in which the beam shaper has aluminium-containing material.

4. Semiconductor laser chip according to claim 3, in which the beam shaper has at least one material combination selected from the group consisting of indium gallium aluminium antimonide, gallium aluminium arsenide antimonide, and indium aluminium arsenide antimonide.

5. Semiconductor laser chip according to claim 1, in which the trench has a width of at most 15 $\mu$m between the edge of the semiconductor laser element from which the laser beam is emitted and the beam-input-end surface of the beam shaper.

6. Method for fabricating a semiconductor laser chip, in which an FP semiconductor laser element is formed; comprising formation of a beam shaper in the exit direction of a laser beam emitted by the semiconductor laser element, in such a manner that the emitted laser beam is guided through the beam shaper, in which case, in order to form the beam shaper, a beam shaper region is formed in the exit direction of a laser beam emitted by the semiconductor laser element, the beam shaper region containing aluminium, a desired aluminium concentration profile is formed in the beam shaper region, a selective oxidation of the beam shaper region is carried out, such that the beam shaper is formed depending on the aluminium concentration profile, and a trench is introduced between the semiconductor laser element and the beam sharer region or the beam shaper.

7. Method according to claim 6, further comprising at least one material combination of at least one of material system selected from the group consisting of indium gallium aluminium antimonide, gallium aluminium arsenide antimonide, and indium aluminium arsenide antimonide.

* * * * *

UNITED STATES PATENT AND TRADEMARK OFFICE
CERTIFICATE OF CORRECTION

PATENT NO. : 6,836,500 B2
DATED : December 28, 2004
INVENTOR(S) : Bernd Borchert It is certified that error appears in the above-identified patent and that said Letters Patent is hereby corrected as shown below:

Column 7,
Line 2, please replace "sharer" with -- shaper --.

Signed and Sealed this

Twenty-fourth Day of May, 2005

JON W. DUDAS
*Director of the United States Patent and Trademark Office*